United States Patent [19]
Gehrke

[11] Patent Number: 5,623,523
[45] Date of Patent: Apr. 22, 1997

[54] METHOD AND APPARATUS FOR INCREASING VOLTAGE IN A CHARGE PUMP USED IN A PHASE LOCKED LOOP

[75] Inventor: James H. Gehrke, Lake in the Hills, Ill.

[73] Assignee: Motorola, Inc., Schaumburg, Ill.

[21] Appl. No.: 335,014

[22] Filed: Nov. 7, 1994

[51] Int. Cl.⁶ .................................................. H03D 3/24
[52] U.S. Cl. .................................................. 375/376; 331/8
[58] Field of Search .................................. 375/376, 373, 375/374, 375; 331/17, 8, 18, 25, 186, 1 A, 185; 327/141, 155, 156, 157, 159, 162

[56] References Cited

U.S. PATENT DOCUMENTS

| | | | |
|---|---|---|---|
| 4,167,711 | 9/1979 | Smoot | 331/8 |
| 5,057,793 | 10/1991 | Cowley et al. | 331/1 A |
| 5,068,626 | 11/1991 | Takagi et al. | 331/25 |
| 5,359,300 | 10/1994 | Minami | 331/17 |
| 5,576,647 | 11/1996 | Sutardja et al. | 327/108 |
| 5,581,584 | 12/1996 | Inoue et al. | 375/376 |

*Primary Examiner*—Wellington Chin
*Assistant Examiner*—Congvan Tran
*Attorney, Agent, or Firm*—Frank M. Scutch, III

[57] ABSTRACT

An apparatus and method of increasing the voltage of a charge pump (111) used in a synthesizer charge pump network (100). The invention enables a voltage boost network (123) to be connected to a charge pump (111) and utilizes a capacitor which is charged and discharged synchronously with the charge pump to allow the charge pump (111) to effectively operate at a higher voltage than ordinary supply (V2). The invention allows the synthesizer charge pump network (100) to be operated in a low voltage condition without providing switching of external voltages greater than supply thereby eliminating EMI and increasing operating efficiency.

10 Claims, 2 Drawing Sheets

METHOD AND APPARATUS FOR INCREASING VOLTAGE IN A CHARGE PUMP USED IN A PHASE LOCKED LOOP

TECHNICAL FIELD

This invention relates phase locked loops and more particularly to charge pumps used in phase locked loops.

BACKGROUND OF THE INVENTION

Frequency synthesizers are used extensively in modern portable and mobile communications equipment and their performance is a key factor in interference reduction. One factor to be considered when using these devices is the battery voltage range. When designing a radio with a frequency synthesizer for use in autos or in a base station with battery backup system, the radio design most often requires the frequency synthesizer voltage supply regulation be set at 9.5 volts or lower. This is to insure the regulator stays out of saturation under all operating conditions. When this limitation is combined with the voltage saturation limits of the voltage controlled oscillator steering circuits, in the synthesizer phase locked loop, the maximum steering range of the voltage controlled oscillator (VCO) is reduced to about 8.5 volts DC or lower. This limited voltage is a problem because for better VCO performance it is desirable to increase this voltage to approximately 11 volts DC.

Normally, this is accomplished by running the phase locked loop charge pump off a higher voltage source such as a switching supply of approximately 12 volts. The problem associated with this technique is that the switching supply generates large amounts of electrical noise. Even if only microvolt spurs of electrical noise are produced, this noise is nevertheless coupled to the VCO and performance will greatly be reduced.

Therefore, the need exists for an electrical circuit which will allow steering of a charge pump current source within a phase locked loop to a higher voltage without utilizing a switching supply. Only in this way can switching noise and other electromagnetic interference (EMI) be eliminated so as not to degrade radio performance.

DETAILED DESCRIPTION OF THE PREFERRED EMBODIMENT

Figure 1:
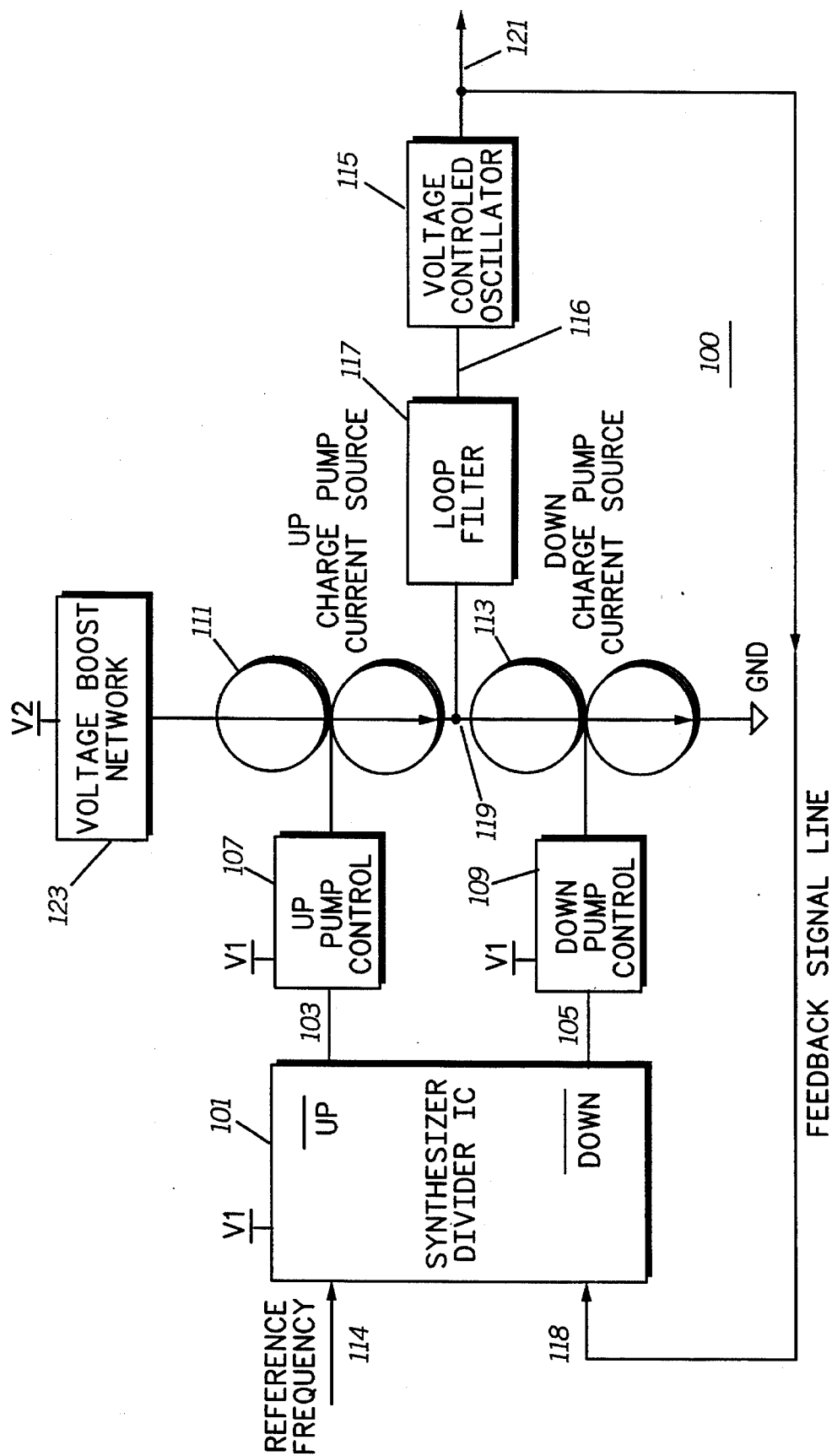
FIG. 1 is a block diagram showing the operation of a preferred embodiment of the invention.

Referring now to FIG. 1, a synthesizer charge pump network 100 includes a synthesizer divider integrated circuit 101. Synthesizer divider integrated circuit 101 includes a phase detector (not shown) for producing a first control signal 103 and a second control signal 105. First control signal 103 is used to control and operate UP pump control 107 while the second control signal 105 is used to control and operate DOWN pump control 109. UP pump control 107 utilizes supply voltage V1 and is used to switch on or off the UP charge pump current source 111. UP charge pump current source 111 sources current to increase the charge on a plurality of capacitors (not shown) located in the loop filter 117. Similarly DOWN pump control 109 also utilizes supply voltage V1 and provides voltage potential to switch on or off the DOWN charge pump current source 113. DOWN charge pump current source 113 sinks current to decrease the charge on the capacitors located in loop filter 117. The UP charge pump current source 111 and the Down charge pump current source 113 charge or discharge the loop filter 117 capacitors to set voltage level of the VCO control signal line 116. This voltage is used to control the frequency of the voltage controlled oscillator (VCO) 115. VCO 115 generates a variable frequency signal at a predetermined amplitude at VCO output signal 121. The output frequency of VCO 115 is compared through feedback signal line 118 with a reference frequency 114 by synthesizer divider integrated circuit 101. This component configuration is generally referred to as a phase locked loop (PLL) where a resultant radio frequency (RF) signal is phase locked to an integer multiple of the reference frequency. The resultant phase error detected by synthesizer divider integrated circuit 101 signal is used to control the UP charge pump current source 111 or the DOWN charge pump current source 113 to adjust the voltage on VCO control signal line 116 to keep the VCO 115 at the desired frequency. For example, if the VCO drifts high in frequency the synthesizer divider integrated circuit 101 will activate DOWN charge pump current source 113 lowering the voltage on VCO control signal line 116 and bringing the frequency of VCO 115 back to a desired frequency. The VCO output signal 121 is used as a stable RF frequency injection source for driving other modules of a communications equipment.

As discussed above, in order to provide a higher voltage than an externally switched supply voltage, the present invention utilizes the narrow duty cycle of the phase locked loop. This is accomplished by inserting voltage boost network 123 between the supply voltage V2 and UP charge pump current source 111. Voltage boost network 123 acts as a storage means or charging capacitor by allowing a stored charge of a specific voltage potential to be applied to UP charge pump current source 111 during a predetermined time. The predetermined time may be when supply voltage V2 drops below a desired level. This allows a greater voltage to be applied to UP charge pump current source 111 than would normally possible with only supply voltage V2 standing alone. Hence, voltage boost network 123 eliminates the need for a switching circuit which would act to switch an external supply at a higher supply voltage to the UP charge pump current source 111.

In operation, while UP charge pump current source 111 is controlled in its on or off state by mode by UP pump control 107, the voltage boost network 123 is also synchronously controlled by UP pump control 107 in a pre-charged and dis-charge state. This has the effect of greatly increasing the voltage to UP charge pump current source 111 to a voltage which may be increased up to substantially double supply voltage V2, applied to UP charge pump current source 111, by UP pump control 107. This increase in voltage at UP charge pump current source 111 increases the performance of the phase locked loop and avoids noise problems due to switching an external above supply voltage.

Thus, a preferred method of using the charge pump network of the present invention includes the steps of supplying a first predetermined voltage i.e. network supply voltage to a voltage boost or voltage increasing network located within the synthesizer charge pump network where the voltage boost network supplies voltage to at least one of two current sources within a phase locked loop. The boost network is then controlled synchronously along with the current source to increase the voltage supplied to the current source to a second predetermined voltage above the supply voltage. This allows the boost network to improve the operating voltage range of the phase locked loop enabling it to operate in a voltage range above a network supply voltage. The step of supplying further includes charging at least one capacitor located with the voltage boost network using the network supply voltage and switching the charge within the capacitor the current source to provide a non-steady state increase of the network supply voltage to the second predetermined voltage level thereby increasing the performance of the phase locked loop.

Figure 2:
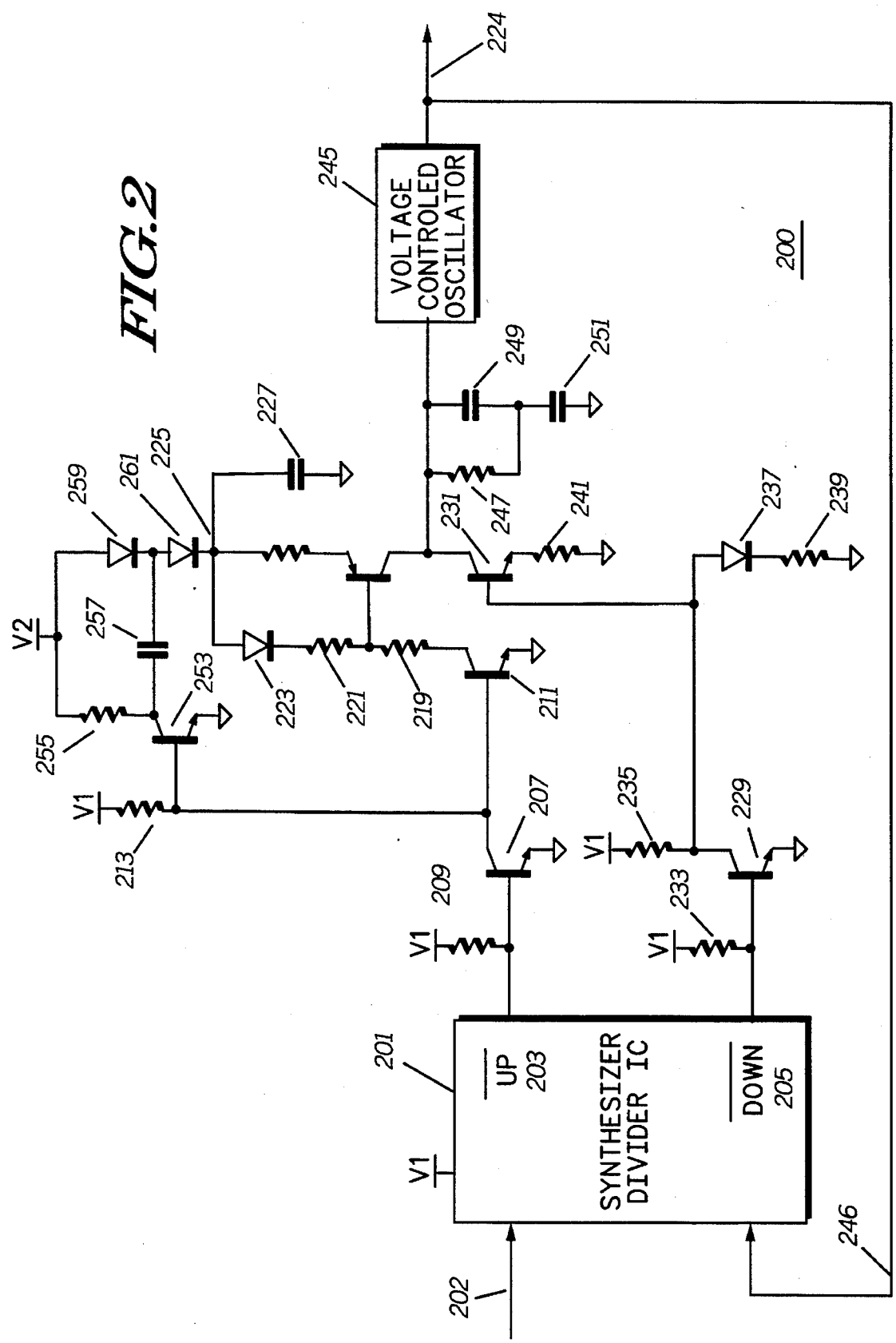
FIG. 2 is a schematic diagram showing a circuit configuration showing use of a voltage boost pump network according to a preferred embodiment of the invention.

FIG. 2 illustrates a schematic of the preferred embodiment of a synthesizer charge pump network 200 using the voltage boost network in accordance with the present invention. A synthesizer divider IC 201 includes a phase detector (not shown) which provides a plurality of control signals. A first control signal 203 is produced which is an inverted UP signal while a second control signal 205 is produced which is an inverted DOWN signal. First control signal 203 is connected to the base of transistor 207 which is an inverting buffer used to invert the first control signal 203. Thus, transistor 207 converts the inverted UP signal into a non-inverted UP signal. Resistor 209 is connected between supply voltage V1 and the base of transistor 207 and is used for limiting the current flow drawn by transistor 207. The collector of transistor 207 is connected to the base of transistor 211 which carries current to control its on/off state. A resistor 213 is connected between supply voltage V2 and the collector of transistor 207 for limiting current flow the transistor 211 and transistor 253. Transistor 217 is a PNP semiconductor device and acts as the UP charge pump current source for the phase locked loop.

The base bias of transistor 217 is set by resistor 221 and diode 223 are connected serially between the base of transistor 217 and node 225 and the connection of resistor 219 to the collector of 211. Transistor 217 is controlled by transistor 211 which operates as a control switch or stage for transistor 217. The emitter of transistor 211 is connected to ground so when switched on the bias network of 217 is active. The resistor 226 connected between node 225 and the emitter of 217, and in conjunction with the base bias, determines the current flow through transistor 217 i.e. the UP charge pump current source magnitude. Charge capacitor 227 is connected between node 225 and ground to reduce AC ripple effects on the voltage potential present at node 225.

The second control signal 205 emitted by synthesizer divider IC 201 is connected to the base of transistor 229. Transistor 229 is a switch or control stage for transistor 231. Transistor 231 is an NPN semiconductor device and acts as the DOWN charge pump current source used in the synthesizer charge pump network 200 i.e. phase locked loop. The emitter of transistor 229 is connected to ground while the collector is connected to the base of transistor 231. Resistor 233 is connected between supply voltage V1 and the base of transistor 229 and works to limit current flow drawn by transistor 229. Resistor 235 is connected between the base of transistor 231 and supply voltage V2. Diode 237 and resistor 239 are serially connected between the base of transistor 231 and ground and along with resistor 235 sets the active state base bias of transistor 231. Resistor 241 is connected between the emitter of transistor 231 and ground, and in conjunction with the base bias of transistor 231 sets the current of transistor 231 i.e. the DOWN charge pump current source magnitude.

The collectors of transistor 217 and transistor 231 are connected at node 243 and work to either inject or drain current from a loop filter circuit shown by resistor 247, capacitor 249 and capacitor 251. The charge of the stored within the filter determines the voltage sent to the voltage controlled oscillator 245. The loop filter acts to attenuate unwanted AC signals from causing spurious emissions by modulation of the voltage controlled oscillator 245 at a predetermined frequency. It should be evident to those skilled in the art that voltage controlled oscillator 245 provides a stable RF signal at VCO output frequency 244 determined by the value of the control voltage provided on VCO control signal line 243. The frequency of VCO 245 is constantly compared and adjusted by means of feedback signal line 246 to be an integer multiple of the reference frequency provided at reference frequency input 202. In order to increase the supply voltage potential above that of supply voltage V2, the preferred embodiment of the invention includes a voltage boost pump network for increasing the voltage at node 225 without using an external voltage supply. Transistor 253 acts to switch a charging voltage, generated by supply voltage V2, through diode 259 to charge capacitor 257 to a predetermined voltage of about one diode voltage drop below V2. In operation, when transistor 217 is on and base current is present through transistor 211, transistor 253 is on which allows charge capacitor 257 to be charged to supply voltage V2 less the diode drop (approximately 0.7 volts) by the connection to V2 through diode 259. When transistor 217 is then turned off using transistor 211, transistor 253 is switched off and the voltage present within charge capacitor 257 is discharged. The series connection of resistor 255, charge capacitor 257 and diode 261 provide a path to charge capacitor 227 at node 225. Thus, the voltage present at node 225 when transistor 253 is switched off is approximately equal to the voltage within charge capacitor 257 plus the voltage present at supply voltage V2. Therefore, when charge capacitor 257 is charged, the voltage potential therein may be used as a pre-charge to increase or boost the maximum voltage on charge capacitor 227 to 2(V2)−2(Vd) where V2 is supply voltage V2 and Vd is the voltage drop across diode 259 and diode 261 at approximately 0.7 volts DC.

Moreover, this increase in voltage has the effect of increasing the maximum steering range of the synthesizer charge pump network 200 without switching external voltages i.e. those other than supply voltage V2 to transistor 217. Therefore, this reduces EMI which would be present with the switching circuits associated with the prior art to eliminate EMI problems and increase efficiency of the charge pump used in the phase locked loop.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A synthesizer charge pump network comprising:

a synthesizer means for providing a range of first control signals;

a voltage controlled oscillator for producing a range of second control signals for controlling said synthesizer means and an output signal at a predetermined frequency;

a plurality of charge pump means connected to said voltage controlled oscillator for providing a plurality of current sources;

a voltage boost means serially connected between at least one of said plurality of charge pump means and a first predetermined supply voltage for increasing said first predetermined supply voltage, applied to said at least one of said plurality of charge pump means, to a second predetermined voltage;

a plurality of charge pump control means controlled by said range of first control signals, where at least one of said plurality of charge pump control means is connected to a respective one of said plurality of charge pump means and said voltage boost means for control information for said at least one of said plurality of charge pump means and said voltage boost means; and wherein a single control signal generated by the synthesizer means is used for maintaining operation of both said voltage boost means and said plurality of charge pump control means in a synchronized manner and further wherein said voltage boost means is actuated by said at least one of said plurality of charge pump control means so as the actuation of said voltage boost means and said at least one of said plurality of charge pump means are substantially synchronized and further wherein said network operates using a limited duty cycle of said plurality of charge pump means to provide a non-steady state boost voltage from said voltage boost means.

2. A synthesizer charge pump network as in claim 1 wherein said range of first control signals include a first charge pump control means signal for controlling a first charge pump means and a second pump control means signal for controlling a second charge pump means.

3. A synthesizer charge pump network as in claim 1 further comprising a filter means connected to said voltage controlled oscillator for eliminating emissions emitted by said voltage controlled oscillator of a predetermined frequency.

4. A synthesizer charge pump network as in claim 1 wherein said voltage boost means comprises at least one capacitor for storing a predetermined voltage potential.

5. A method of increasing the operating voltage range of a synthesizer charge pump network, said synthesizer charge pump network including a phase locked loop having a plurality of current sources, the method comprises the steps of:

supplying a first predetermined voltage to a voltage increasing network located within said synthesizer charge pump network, said voltage increasing network supplying voltage to at least one current source of said plurality of current sources;

controlling said voltage increasing network synchronously with said at least one current source with a single control signal from a synthesizer divider to increase the voltage supplied to said at least one current source to a second predetermined voltage;

charging at least one capacitor located with said voltage increasing network using said first predetermined voltage;

switching the charge within said at least one capacitor to said at least one current source to provide a non-steady state increase of said first predetermined voltage to said second predetermined voltage thereby increasing the performance of said phase locked loop; and whereby said voltage increasing network improves the operating voltage range of said phase locked loop enabling it to operate in a voltage range above said network supply voltage.

6. A method of increasing the performance of a phase locked loop as in claim 5 wherein said at least one current source includes at least one transistor.

7. A synthesizer charge pump network comprising:

a first charge pump controlled by a first control means and powered by a voltage supply for providing a first current source in a phase locked loop;

a second charge pump controlled by a second control means for providing a second current source in said phase locked loop;

a synthesizer for providing a plurality of control signals to said first control means and said second control means;

an oscillator connected to said first charge pump and said second charge pump for providing a radio frequency (RF) signal;

a storage network attached to said first control means and said first charge pump for storing a voltage potential of a predetermined value from said voltage supply; and wherein said storage network is synchronously charged with said first charge pump and is actuated when said first charge pump is actuated using a single control signal generated by the synthesizer to increase the supply voltage applied to said first charge pump thereby increasing the efficiency of said phase locked loop in a low voltage condition and further wherein said synthesizer charge pump network operates using a limited duty cycle of said first charge pump and said second charge pump to provide a non-steady state boost voltage from said storage network.

8. A synthesizer charge pump network as in claim 7 further comprising a filter connected between said oscillator and said first charge pump and said second charge pump for removing unwanted emissions by said oscillator.

9. A synthesizer charge pump network as in claim 7 wherein said oscillator is a voltage controlled oscillator.

10. A synthesizer charge pump network as in claim 7 wherein said plurality of control signals includes a first control signal for controlling said first control means and a second control signal for controlling said second control means.

* * * * *